(12) United States Patent
DeGeronimo

(10) Patent No.: US 7,187,316 B1
(45) Date of Patent: Mar. 6, 2007

(54) METHOD AND APPARATUS FOR CLOCKLESS ANALOG-TO-DIGITAL CONVERSION AND PEAK DETECTION

(75) Inventor: Gianluigi DeGeronimo, Syosset, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 0 days.

(21) Appl. No.: 11/346,831

(22) Filed: Feb. 6, 2006

(51) Int. Cl.
*H03M 1/12* (2006.01)

(52) U.S. Cl. ................................. 341/155; 341/161

(58) Field of Classification Search ............... 341/118, 341/155, 161, 132
See application file for complete search history.

(56) References Cited

U.S. PATENT DOCUMENTS

| | | | |
|---|---|---|---|
| 4,179,687 A * | 12/1979 | van de Plassche et al. | 341/162 |
| 4,608,555 A * | 8/1986 | Hoeft | 341/133 |
| 4,994,808 A | 2/1991 | Wichelman | |
| 5,014,057 A | 5/1991 | Mintzer | |
| 5,021,784 A * | 6/1991 | Groeneveld et al. | 341/120 |
| 5,283,582 A * | 2/1994 | Krenik | 341/158 |
| 5,719,575 A * | 2/1998 | Hashimoto | 341/144 |
| 5,963,158 A * | 10/1999 | Yasuda | 341/136 |
| 6,038,169 A * | 3/2000 | Ogura et al. | 365/185.11 |
| 6,198,421 B1 | 3/2001 | Doyle et al. | |
| 6,859,091 B1 * | 2/2005 | Nicholson et al. | 327/536 |
| 6,891,495 B2 * | 5/2005 | Chen et al. | 341/161 |
| 6,987,380 B1 * | 1/2006 | Lee | 323/285 |
| 7,002,505 B2 * | 2/2006 | Hughes | 341/161 |

OTHER PUBLICATIONS

P. Fischer, A. Helmich, M. Lindner, N. Wermes, L. Blanquart, "A Photon Counting Pixel Chip With Energy Windowing", IEEE Trans. Nucl. Sci., vol. 47, No. 3, Jun. 2000, pp. 881-884.

M. Clajus, T. O. Tuner, G. J. Visser, S. Yin, P. D. Willson, D. G. Maeding, "Front-End Electronics For Spectroscopy Applications (FESA) IC", IEEE Nuclear Science Symposium Conference Record, 2000 vol. 2, Oct. 15-20, 2000, pp. 9/227-9/229.

G. De Geronimo, P. O'Connor, R. H. Beuttenmuller, Z. Li, A. J. Kuczewski, D. P. Siddons, "Development Of A High-Rate High-Resolution Detector For EXAFS Experiments", IEEE Trans. Nucl. Sci., vol. 50, No. 4, Aug. 2003, pp. 885-891.

V.B. Cajipe, R.F. Calderwood, M. Clajus, B. Grattan, S. Hayakawa, R. Jayaraman, T.O. Tumer, O. Yossifor, "Multi-Energy X-Ray Imaging With Linear CZT Pixel Arrays And Integrated Electronics", IEEE Nuclear Science Symposium Conference Record, 2004 vol. 7, Oct. 16-22, pp. 4369-4372.

(Continued)

*Primary Examiner*—Peguy JeanPierre
(74) *Attorney, Agent, or Firm*—Lori-Anne Neiger

(57) ABSTRACT

An apparatus and method for analog-to-digital conversion and peak detection includes at least one stage, which includes a first switch, second switch, current source or capacitor, and discriminator. The discriminator changes state in response to a current or charge associated with the input signal exceeding a threshold, thereby indicating whether the current or charge associated with the input signal is greater than the threshold. The input signal includes a peak or a charge, and the converter includes a peak or charge detect mode in which a state of the switch is retained in response to a decrease in the current or charge associated with the input signal. The state of the switch represents at least a portion of a value of the peak or of the charge.

33 Claims, 11 Drawing Sheets

OTHER PUBLICATIONS

P. Grybos, A. E. Cabal Rodriquez, M. Idzik, J. Lopez Gaitan, F. Prino, L Ramello, K. Swientek, P. Wiacek, "RX64DTH—A Fully Integrated 64-Channel ASIC For A Digital X-Ray Imaging System With Energy Window Selection", IEEE Trans. Nucl. Sci., vol. 52, No. 4, Aug. 2005, pp. 839-846.

C. Barlag, L. Carlen, K. El Chenawi, S. Grapman, H. A. Gustafsson, S. Gustafsson, N. Heine, K. H. Kampert, S. Louw, H. Lohner, A. Oskarsson, I. Otterlund, K. Reygers, E. Stenlund, T. Svensson, R. Sundblad, K. Soderstorm, L. Osterman, "A 16 Channel VLSI Chip, Containing Amplifier And Analog To Digital Converter, For The Readout Of Highly Granular Particle Detectors", Nucl. Instrum. Meth. A, vol. 406, 1998, pp. 299-306, no month.

T. Kihm, V. F. Bobrakov, H. V. Klapdor-Kleingrothaus "A Digital Multi-Channel Spectroscopy System With 100 Mhz Flash ADC Module For The GENIUS-TF And GENIUS Projects", Nucl. Instrum. Meth. A, vol. 498, 2003, pp. 334-339, no month.

G. De Geronimo, J. Fried, P. O'Connor, V. Radeka, G. C. Smith, C. Thorn, B. Yu, "Front-End ASIC For A GEM Based Time Projection Chamber", IEEE Trans. Nucl. Sci., vol. 51, No. 4, Aug. 2004, pp. 1312-1317.

G. Mazza, A. Rivetti, G. Anelli, F. Anghinolfi, M. I. Martinez, F. Rotondo, "A 32-Channel, 0.25μM CMOS ASIC For The Readout Of The Silicon Drift Detectors Of The ALICE Experiment", IEEE Trans. Nucl. Sci., vol. 51, No. 5, Oct. 2004, pp. 1942-1947.

S. Buzzetti, M. Capou, C. Guazzoni, A. Longoni, R. Mariani, S. Moser, "High-Speed FPGA-Based Pulse-Height Analyzer For High Resolution X-Ray Spectroscopy", IEEE Trans. Nucl. Sci., vol. 52, No. 4, Aug. 2005, pp. 854-860.

G. De Geronimo, A. Kandasamy, P. O'Connor, "Analog Peak Detector And Derandomizer For High Rate Spectroscopy", IEEE Trans. Nucl. Sci., vol. 49, No. 4, Part 1, Aug. 2002, pp. 1769-1773.

M. L. Prydderch, N. J. Waltham, R. Turchetta, M. J. French, R. Holt, A. Marshall, D. Burt, R. Bell, P. Pool, C. Eyles, H. Mapson-Menard, "A 512x512 CMOS Monolithic Active Pixel Sensor With Integrated Adcs For Space Science", Nucl. Instrum. Meth. A, vol. 512, 2003, pp. 358-367.

P. O. Pouliquen, K. A. Boahen, A. G. Andreaou, "A Gray-Code MOS Current-Mode Analog-To-Digital Converter Design", IEEE International Sympoisum on Circuits and Systems, 1991, vol. 4, pp. 1924-1927, no month.

J. E. Lees, D. Bassford, C. Whitford, O. Blake, "Novel Electronics For MCP Imaging Detectors", Nucl. Instrum. Meth. A, vol. 537, 2005, pp. 621-625, no month.

* cited by examiner

Shaped Pulse

METHOD AND APPARATUS FOR CLOCKLESS ANALOG-TO-DIGITAL CONVERSION AND PEAK DETECTION

This invention was made with support from the U.S. Government under Contract No. DE-AC0298CH10886 by the U.S. Department of Energy. The U.S. Government has certain rights in the invention.

BACKGROUND OF THE INVENTION

1. Field of the Invention

The present invention relates to analog-to-digital conversion, and more particularly to performing analog-to-digital conversion without requiring a clock signal.

2. Description of the Prior Art

The front-end portion of a radiation detection system, as shown in FIG. 1, typically includes a sensor 12 (e.g. pixel), which provides the conversion of the ionizing radiation into a charge Q, a charge amplifier 14, which provides conversion of the charge Q into a voltage V, and a filter or shaping amplifier 16, which shapes the signal into a pulse P shown in FIG. 2 with an amplitude proportional to the charge Q. The sensor 12 has pixel capacitance $C_p$, the charge amplifier 14 has input capacitance $C_i$ and feedback capacitance $C_f$, and the filter 16 has a shaped pulse peaking time $\tau_P$.

Due to its proportionality to the input charge Q, the peak amplitude of the shaped pulse P is the quantity of interest and it is subject to further signal processing. In all cases, the peak amplitude is converted (quantized) into one of m discrete levels. In some applications, a counter is associated with each of the m levels, and the counter is incremented if the amplitude of an event falls within that level. In other applications, an encoded digital word (typically an n-bit word where $m=2^n$) is associated with each of the m levels, and for each event a corresponding digital word is stored. Depending on the application, the number m of discrete levels can vary from the simplest case of 1, where if the amplitude is below threshold, the bit is 0, and if the amplitude is above threshold, the bit is 1, to a number that can be as high as 20 or more for very high resolution measurements.

The need for high spatial resolution and high rate capability requires the development of radiation detection systems in which the front-end and processing electronics per channel is highly integrated. Application Specific Integrated Circuits (ASICs) that integrate an increasing amount of front-end and processing electronics are needed in order to satisfy these requirements. The integration of efficient circuits for the processing of the shaped pulses represents a challenge, especially when the number m of discrete levels exceeds a few units.

Previous attempts to solve this problem of processing the shaped pulses include: (a) multiple windows discrimination, (b) analog peak detection followed by peak digitization, and (c) shaped pulse digitization with digital peak detection. These concepts, their disadvantages, and their shortcomings are discussed below.

Multiple-Windows Discrimination

When the number of discrete levels m is limited to a few units, the multiple-windows discrimination approach is typically adopted, as shown in FIG. 3. This approach uses m−1 discriminators 18 (each referenced to a defined threshold level) and additional logic 20 in order to select the appropriate window in correspondence to the event. Some applications may require the use of only two windows realized by a single threshold level, thus simply identifying the occurrence of the event. Other applications may need more windows in order to provide the required amplitude discrimination.

The main disadvantage of this approach appears when the number of windows exceeds a few units. The power dissipated by each discriminator 18, depending on the required speed and accuracy, ranges typically around several tens of μW or more. Since the power dissipated by the whole front-end channel must frequently be contained within a few hundreds of μW or less, only a very limited number of discriminators 18, and consequently discrete levels, can be implemented in a single channel.

Analog Peak Detection Followed by Peak Digitization

As the number of discrete levels m increases above a few units, the multiple-windows discrimination approach becomes impractical and the analog peak detection with peak digitization method shown in FIG. 4 is typically adopted. This approach uses a peak detection circuit 22 followed by an n-bit analog-to-digital converter (ADC) 24, thus providing $m=2^n$ windows. The accuracy required from the peak detection circuit 22 to the ADC 24 (i.e. number n of bits) depends on the application.

The primary disadvantage of this approach is the amount of power required by the peak detection and the on-chip analog-to-digital conversion per channel. The peak detection circuit 22 may dissipate only a few hundreds of μWs. But the typical power dissipation of the ADC 24 can be very high, depending on the required speed (samples per second, S/s) and resolution (i.e. number n of bits). There are a very large number of ADC architectures available, but only very few configurations may actually satisfy the stringent power requirements of any particular application. Some mixed solutions make use of multiplexers and arbitration logic to share one ADC among several channels to save power, but this saving is at the expense of substantially greater complexity.

Another disadvantage of this approach is the need for an external or internally generated clock signal, which is required by the ADC 24 in order to provide the conversion. The clock signal can easily interfere with the low-noise analog front-end circuitry with consequent degradation of the resolution. The clock frequency depends on the speed of the ADC 24, and the number of clock cycles per conversion can be as high as n for a low-power ADC.

One last disadvantage is represented by the total amount of time required for detecting and converting the peak, which is equal to the sum of the peak detection time plus the conversion time. Depending on the speed of the ADC and the rate of the application, this time can become long enough to cause loss of data.

Shaped Pulse Digitization with Digital Peak Detection

The shaped pulse digitization with digital peak detection approach shown in FIG. 5 uses a fast n-bit ADC 26 to convert the shaped pulse before a digital peak detection circuit 28. The peak is digitally extracted by the peak detection circuit 28 using a Digital Signal Processor (DSP). The accuracy and speed required from the ADC depend on the application.

The main disadvantage of this approach is the power required to provide fast on-chip analog-to-digital conversion per channel. The power dissipation of the fast ADC 26 can be very high (and will likely exceed that of the analog peak detection followed by peak digitization approach described above) depending on the required speed and resolution. In addition, the disadvantage of requiring an external or internally generated clock applies in this method.

Thus, there is need in radiation detection systems for peak detection and analog-to-digital conversion of the shaped analog pulse, which represents an ionizing event, which minimizes power requirements and does not require a clock signal.

SUMMARY OF THE INVENTION

The present invention, which addresses the needs of the prior art, relates to an analog-to-digital converter including at least a first stage. The first stage includes a first switch, a second switch, a first current source, and a first discriminator. The first terminal of the first switch is coupled to an input signal, and the first terminal of the second switch is coupled to the second terminal of the first switch. The first current source is coupled to the second terminal of the first switch, and at least a portion of a first threshold is determined by the first current source. The first discriminator is coupled to the second terminal of the second switch. The second switch is closed and the first switch is closed. The first discriminator changes state and the second switch is opened in response to a current associated with the input signal exceeding the first threshold, thereby indicating whether the current associated with the input signal is greater than the first threshold.

The first switch and/or the second switch may be responsive to the control circuit, and the input signal may have a positive and/or negative polarity. The first discriminator may include at least one of an inverter, non-inverter, Schmitt trigger, and gate. The input signal includes a peak, and the converter includes a peak detect mode, in which a state of the second switch is retained in response to a decrease in the current associated with the input signal following the peak. The state of the first switch may represent at least a portion of a value of the peak.

The converter may include a second stage, which includes a third switch, a fourth switch, a second current source, and a second discriminator. The first terminal of the third switch is coupled to the input signal, and the first terminal of the fourth switch is coupled to the second terminal of the third switch. The second current source is coupled to the second terminal of the third switch, and at least a portion of a second threshold is determined by the second current source. The second discriminator is coupled to the second terminal of the fourth switch. The fourth switch is closed. The third switch is closed in response to the current associated with the input signal exceeding the first threshold. The second discriminator changes state and the fourth switch is opened in response to the current associated with the input signal exceeding the second threshold, thereby indicating whether the current associated with the input signal is greater than the second threshold. The input signal includes a peak, and the converter may include a peak detect mode, in which a state of the fourth switch is retained in response to a decrease in the current associated with the input signal following the peak. The state of the third switch may represent at least a portion of a value of the peak.

The present invention further relates to an analog-to-digital converter including at least one stage, which includes a first switch, a second switch, a first capacitor, and a first discriminator. The first terminal of the first switch is coupled to an input signal, and the first terminal of the second switch is coupled to the second terminal of the first switch. The first capacitor is coupled in parallel across the first and second terminals of the second switch, and at least a portion of a first threshold is determined by the first capacitor. The first discriminator is coupled to the first terminal of the second switch. The first switch is closed and the second switch is open. The first discriminator changes state in response to a charge associated with the input signal exceeding the first threshold, thereby indicating whether the charge associated with the input signal is greater than the first threshold.

The converter may include a charge detect mode, in which the charge of the first capacitor is retained in response to a decrease in the charge associated with the input signal. The state of the first switch may represent at least a portion of a value of the input charge.

The converter may include a second stage, which includes a third switch, a fourth switch, a second capacitor, and a second discriminator. The first terminal of the third switch is coupled to the input signal, and the first terminal of the fourth switch is coupled to the second terminal of the third switch. The second capacitor is coupled in parallel across the first and second terminals of the fourth switch, and at least a portion of a second threshold is determined by the second capacitor. The second discriminator is coupled to the first terminal of the second switch. The third switch is closed and the fourth switch is opened in response to the charge associated with the input signal exceeding the first threshold. The second discriminator changes state in response to the charge associated with the input signal exceeding the second threshold, thereby indicating whether the charge associated with the input signal is greater than the second threshold.

A resistor may be coupled in series with the input signal. The converter may include a charge detect mode, in which the charge of the second capacitor is retained in response to a decrease in the charge associated with the input signal. The state of the third switch may represent at least a portion of a value of the input charge.

The present invention yet further relates to a method of analog-to-digital conversion, which includes coupling a first terminal of a first switch to an input signal, coupling a first terminal of a second switch to a second terminal of the first switch, wherein the second switch is closed. The method further includes coupling a first current source to the second terminal of the first switch, coupling a first discriminator to a second terminal of the second switch, closing the first switch, and opening the second switch and the discriminator changing state in response to a current associated with the input signal exceeding the first threshold, thereby indicating whether the current associated with the input signal is greater than the first threshold.

The input signal includes a peak, and the converter may include a peak detect mode including retaining a state of the second switch in response to a decrease in the current associated with the input signal following the peak. The state of the first switch may represent at least a portion of a value of the peak. The method may also include coupling a first terminal of a third switch to an input signal, coupling a first terminal of a fourth switch to a second terminal of the third switch. The fourth switch is closed. The method may also include coupling a second current source to a second terminal of the third switch, coupling a second discriminator to a second terminal of the fourth switch, closing the third switch in response to the current associated with the input signal exceeding the first threshold, and opening the fourth switch and the second discriminator changing state in response to the current associated with the input signal exceeding the second threshold, thereby indicating whether the current associated with the input signal is greater than the second threshold.

The input signal includes a peak, and the converter may include a peak detect mode including retaining a state of the fourth switch in response to a decrease in the current associated with the input signal following the peak. The state of the third switch may represent at least a portion of a value of the peak.

The present invention yet further relates to a method of analog-to-digital conversion, which includes coupling a first terminal of a first switch to an input signal, coupling a first terminal of a second switch to a second terminal of the first switch, coupling a first capacitor in parallel across the first and second terminals of the second switch, coupling a first discriminator to the first terminal of the second switch, and closing the first switch and opening the second switch. The first discriminator changes state in response to a charge associated with the input signal exceeding the first threshold, thereby indicating whether the charge associated with the input signal is greater than the first threshold.

The converter may include a charge detect mode including retaining the charge of the first capacitor in response to a decrease in the charge associated with the input signal. The state of the first switch may represent at least a portion of a value of the input charge. The method may also include coupling a first terminal of a third switch operatively to the input signal, coupling a first terminal of a fourth switch operatively to a second terminal of the third switch, coupling a second capacitor operatively in parallel across the first and second terminals of the fourth switch, coupling a second discriminator operatively to the first terminal of the second switch, and closing the third switch and opening the fourth switch in response to the first discriminator changing state. The second discriminator changes state in response to a charge associated with the input signal exceeding the second threshold, thereby indicating whether the charge associated with the input signal is greater than the second threshold. The method may include coupling a resistor in series with the input signal. The converter may include a charge detect mode including retaining the charge of the second capacitor in response to a decrease in the charge associated with the input signal. The state of the third switch may represent at least a portion of a value of the input charge.

As a result, the present invention provides peak detection and analog-to-digital conversion of shaped analog pulses caused by an ionizing event in a radiation detection system without requiring a clock signal and using very little power. In addition, since analog-to-digital conversion occurs during a rising edge of the shaped pulse and conversion is complete when the peak occurs, the present invention advantageously minimizes the processing time of the shaped pulse and, as a consequence, the loss of data. These and other objects, features, and advantages of this invention will become apparent from the following detailed description of illustrative embodiments thereof, which is to be read in connection with the accompanying drawings.

DETAILED DESCRIPTION OF THE PREFERRED EMBODIMENTS

Figure 1:
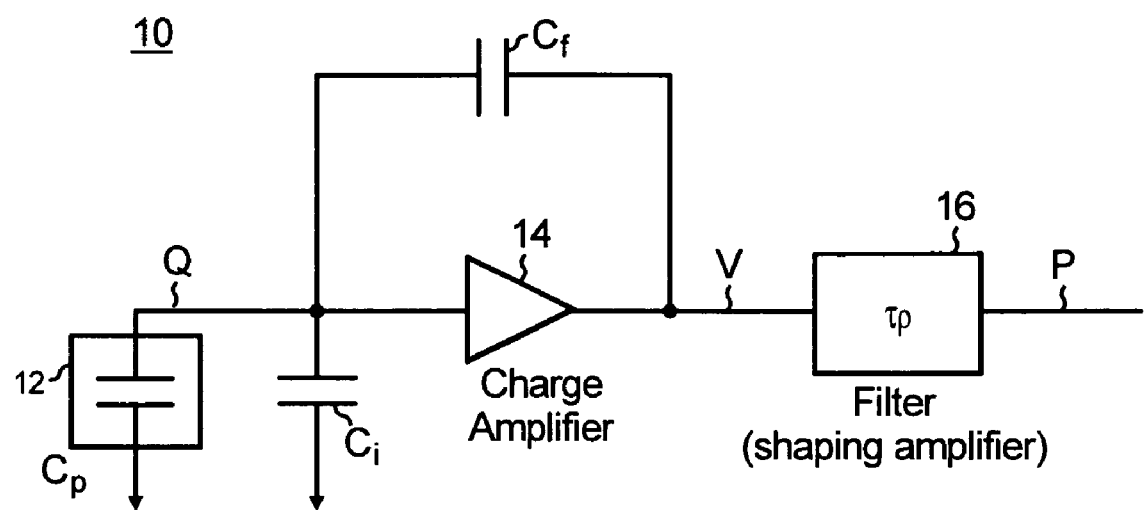
FIG. 1 is a block diagram of a front-end portion of a radiation detection system.
Figure 2:
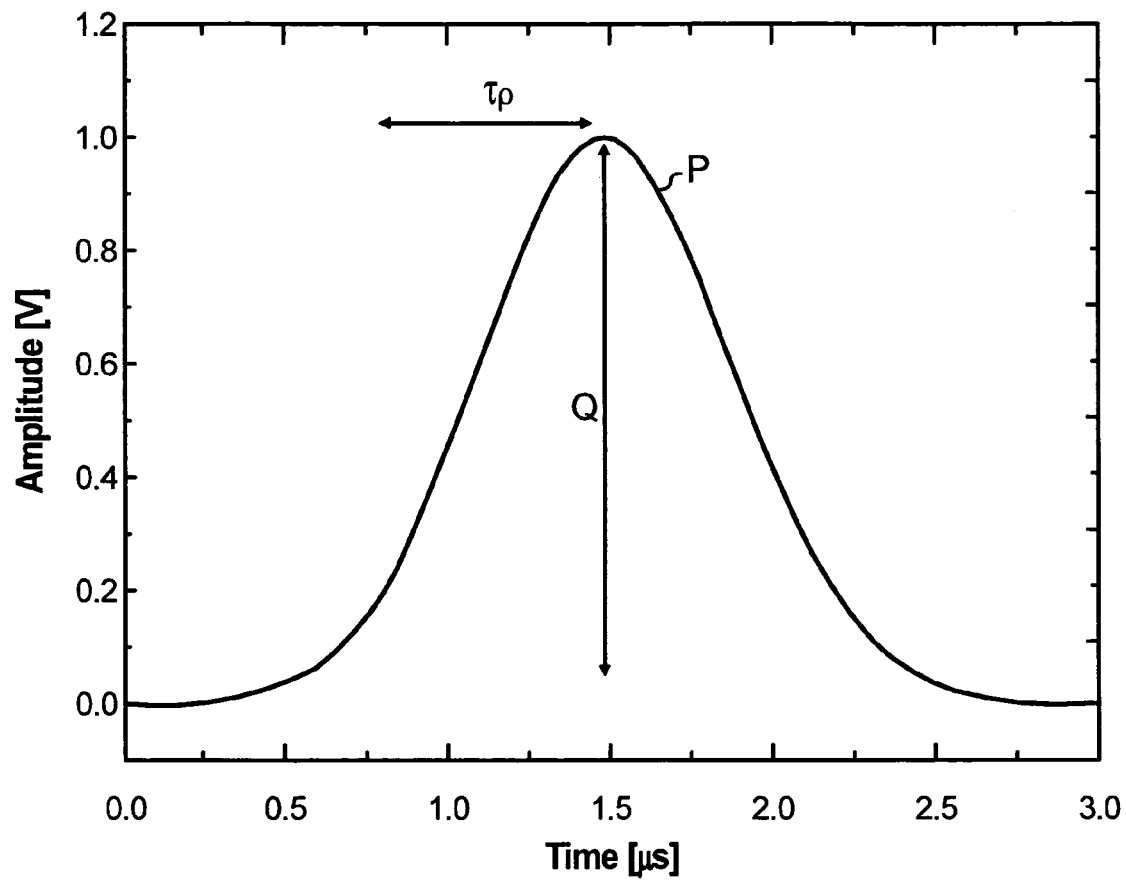
FIG. 2 is a graph of amplitude versus time for a shaped pulse output by the front-end portion shown in FIG. 1.
Figure 3:
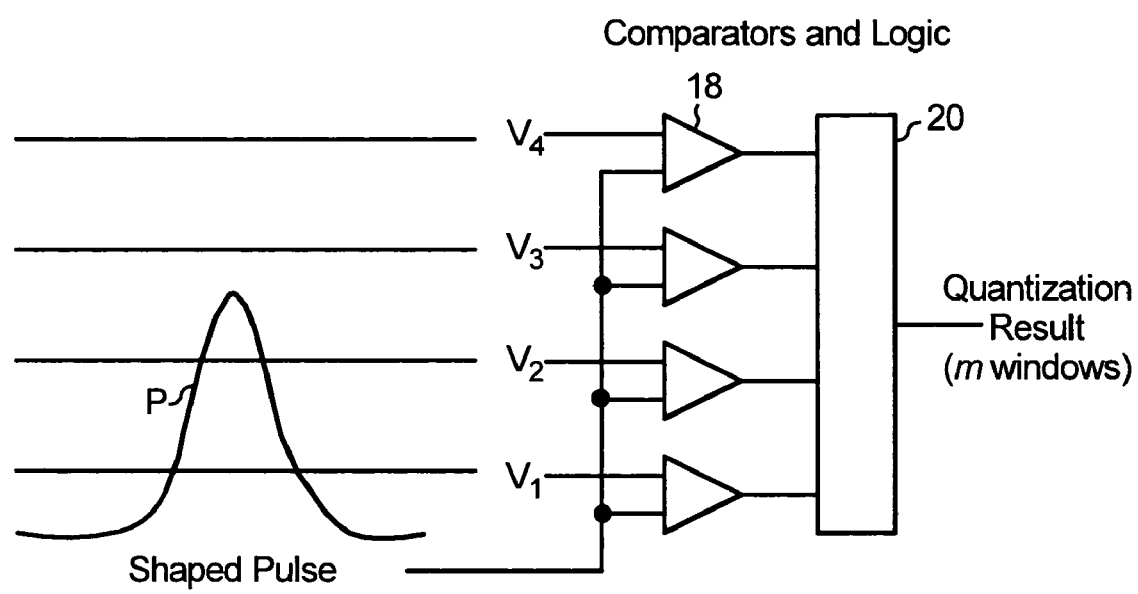
FIG. 3 is a block diagram of a multiple windows discrimination method for processing the shaped pulse
Figure 4:
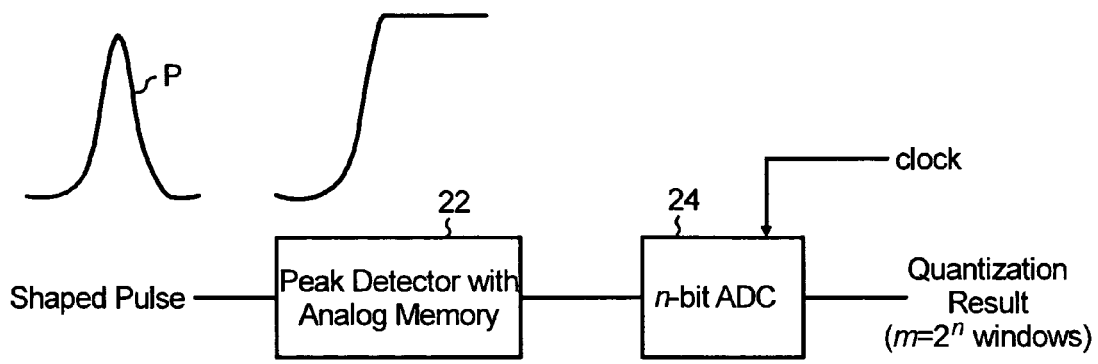
FIG. 4 is a block diagram of an analog peak detection followed by peak digitization method for processing the shaped pulse
Figure 5:
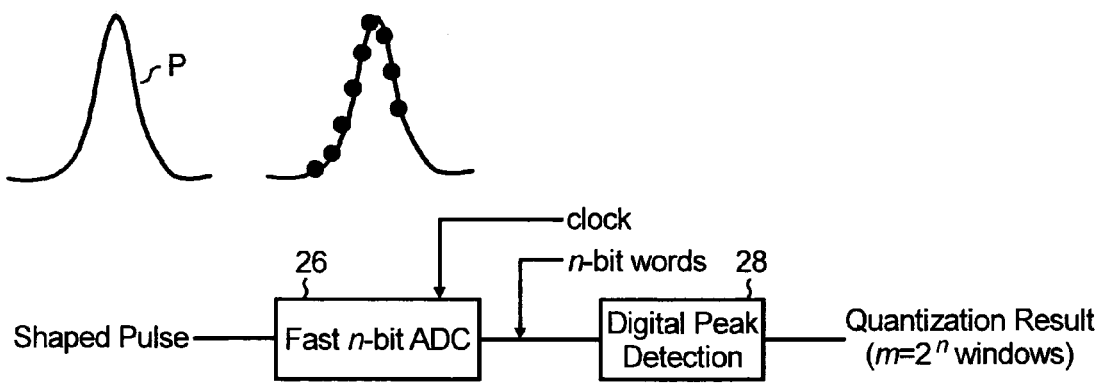
FIG. 5 is a block diagram of a shaped pulse digitization with digital peak detection method for processing the shaped pulse
Figure 6:
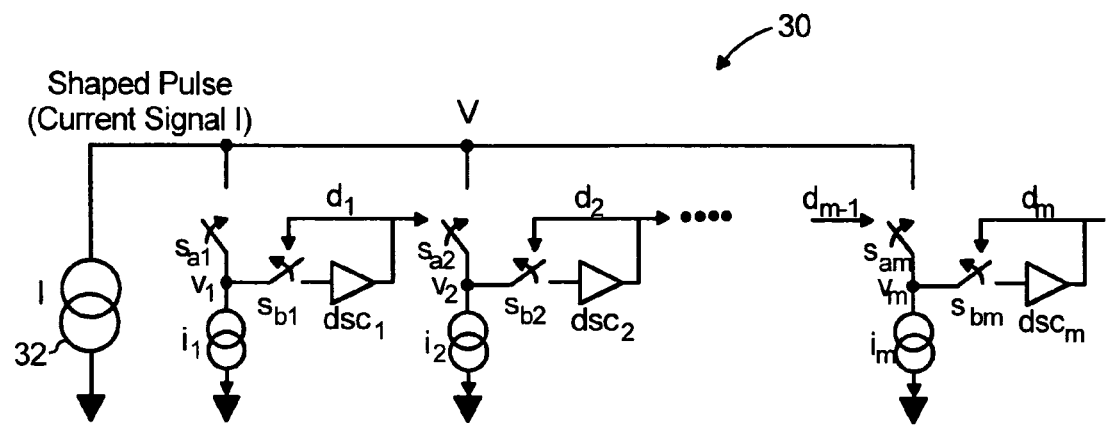
FIG. 6 is a schematic diagram of a clockless analog-to-digital converter and peak detector circuit formed in accordance with the present invention for processing current pulses.
Figure 12:
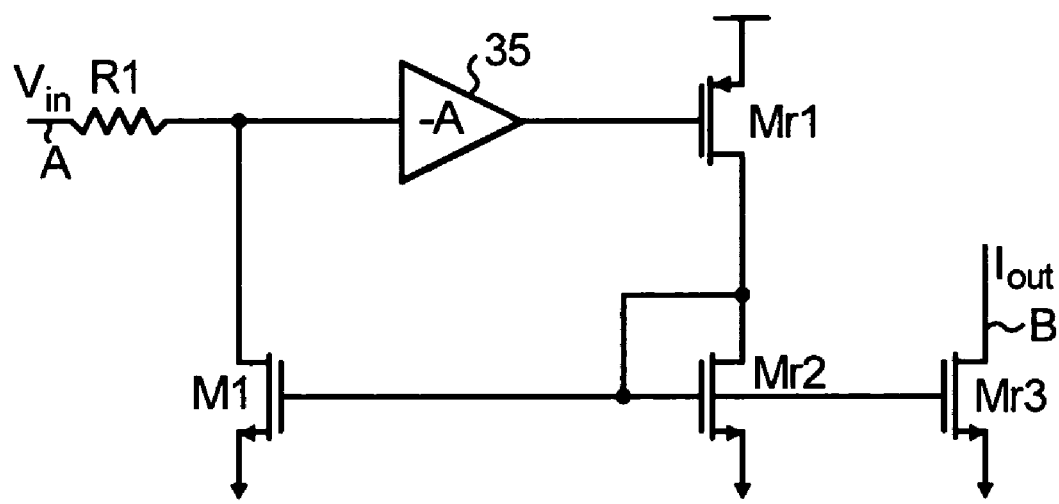
FIG. 12 is a schematic diagram of a voltage-to-current conversion circuit.

A clockless analog-to-digital converter and peak detector circuit 30 formed in accordance with the present invention and shown in the schematic diagram of FIG. 6 provides peak detection and analog-to-digital conversion of a shaped pulse, which represents an ionizing event, from a front-end portion of a radiation detection system. The circuit 30 exhibits low power dissipation, requires little power, and does not need a clock signal. The circuit 30 is preferably operated in current-mode, which means that it operates on the basis of current rather than voltage. If the shaped pulse is a voltage signal, a voltage-to-current converter is preferably used to convert the signal before processing by this circuit. A representative voltage-to current conversion circuit 33 is shown in FIG. 12, in which the voltage signal is applied at terminal A and the current signal is obtained from terminal B. The circuit 33 preferably includes four (4) transistors Mr1, Mr2, M1, M2, a resistor R1, and an amplifier 35 with negative gain –A.

In FIG. 6, the shaped pulse is represented by a current signal generator 32 providing a current I. The circuit preferably includes m cells, where m is the number of desired discrete levels. Each jth cell (where j=1 to m) preferably implements two switches $s_{aj}$ and $s_{bj}$, a discriminator $dsc_j$ (which may be implemented as a logic gate with negligible static dissipation, an inverter, a non-inverter, a Schmitt trigger, a gate with or without hysteresis, and the like) and a current source $i_j$. In the case where the discrete levels must be equally spaced, all current sources $i_j$ must be matched.

In a first stage of the circuit 30 shown in FIG. 6, a first terminal of switch $s_{aj}$ is connected to the current signal generator 32, and a second terminal of switch $s_{a1}$ is connected to current source $i_1$, at which point voltage $v_1$ is defined at the second terminal of switch $s_{a1}$. A first terminal of switch $s_{b1}$ is connected to the second terminal of switch $s_{a1}$, and a second terminal of switch $s_{b1}$ is connected to an input terminal of discriminator $dsc_1$. An output terminal of discriminator $dsc_1$ is used to control switch $s_{b1}$ and switch $s_{a2}$ in a second stage of the circuit 30, which includes substantially similar components and connections as that described in connection with the first stage.

Initially, all $s_{aj}$ switches are open and all $s_{bj}$ switches are closed. All voltages $v_j$ are equal to 0V. The processing of the pulse preferably starts with the switch $s_{a1}$ being closed. As the current I increases following the rising edge of the pulse, it is continuously compared to the unit current $i_1$ of the first cell. As long as the current I is less than the current $i_1$, the voltage $v_1$ remains at 0V. If the current I becomes greater than the unit current $i_1$, then the voltage $v_1$, which is equal to the voltage V, increases from 0V until the discriminator $dsc_1$ changes state. At that time, the switch $s_{b1}$ is opened and the switch $s_{a2}$ is closed, adding one unit of current $i_2$. The voltage $v_2$ rapidly increases towards the voltage V. The current I is now compared to the sum of $i_1$ and $i_2$ and, depending on the result, V will decrease to 0V or will increase forcing the next discriminator $dsc_2$ to change state. A new unit current $i_3$ will be added for the current comparison, and so on.

The enabling of further units of current will proceed as the rising edge of the current pulse is tracked. Once the pulse reaches its peak, the current I will start decreasing following the falling edge of the pulse. Since the switches $s_{bj}$ of the enabled cells are now open, the corresponding unit currents cannot be disabled and the quantized peak current is preserved and converted into the discrete level that corresponds to the last enabled unit current. The voltage V decreases due to the comparison between the quantized peak current and the input current I. This decrease can be used an indicator of peak detection and the end of conversion. The result of the peak detection and conversion can be used to increment on-chip counters or can be suitably encoded into a digital word of n-bits where $m=2^n$ as, for example shown in FIG. 8. Depending on the speed of the input pulse, each current source $i_j$ preferably operates at a current that can range from few tens of nA to few μA. The power dissipated by the circuit 30 equals the unit current times the number of discrete levels m and it can be easily contained within a few tens of μW even for a large number of levels.

The circuit 30 described above operates with currents in a peak-detect mode or tracking mode. Accordingly, circuit 30 provides information concerning the peak of the input current pulse.

Compared to prior attempts to solve the problems of conventional circuits, the present invention has the advantage of providing, at the same time, peak detection and analog-to-digital conversion at very low power and without the need of a clock signal. In addition, the conversion is already available at the time the peak occurs, thus minimizing the processing time and, consequently, the loss of data.

An additional function that disables the control of the switches $s_{bj}$ can be implemented. In this case, the switches $s_{bj}$ will be progressively enabled or disabled depending on the shape of the current signal I. The resulting circuit provides continuous tracking and quantization of the current signal I. This function can be used, for example, in applications where the periodic quantization of the waveform is needed.

Figure 7:
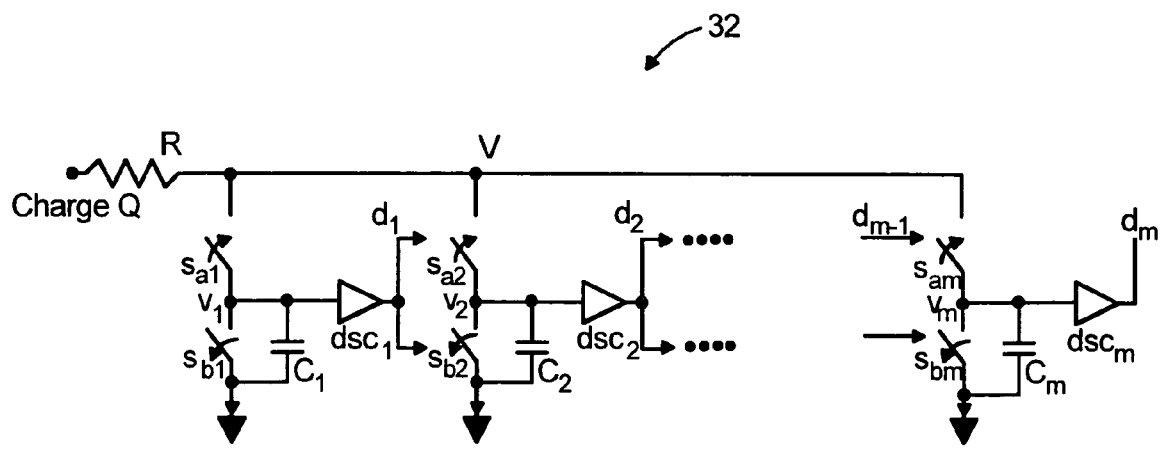
FIG. 7 is a schematic diagram of a second embodiment of the clockless analog-to-digital converter and peak detector circuit shown in FIG. 6 for processing charge pulses.

A schematic diagram of a second embodiment of a circuit 32 formed in accordance with the present invention is shown in FIG. 7. In this circuit 32, the units of current are replaced by units of capacitance and the charge Q is directly converted into a digital word. There is no need for peak detection in the circuit 32. The circuit 32 includes m cells, where m is the number of desired discrete levels. Each j cell (where j=1 to m) includes two switches $s_{aj}$ and $s_{bj}$, a logic discriminator $dsc_j$, and a capacitor $C_j$. If each of the discrete levels are to be equally spaced, all capacitors $C_j$ must be matched.

The charge Q in FIG. 7 is preferably applied to a first terminal of a resistor R and a second terminal of the resistor R is connected to a first terminal of the switch $s_{a1}$ in a first stage of the circuit 32. The second terminal of switch $s_{a1}$ is connected to a first terminal of switch $s_{b1}$, at which point a voltage $v_1$ is defined. A second terminal of switch $s_{b1}$ is preferable connected to ground, and a capacitor $C_1$ is preferably in parallel across the first and second terminals of switch $s_{b1}$. The first terminal of switch $s_{b1}$ is also connected to an input terminal of discriminator $dsc_1$. An output terminal of discriminator $dsc_1$ is used to control switches $s_{a2}$ and $s_{b2}$ in a second stage of the circuit 32. The second stage preferably includes substantially similar components and connections to that described in connection with the first stage.

All $s_{aj}$ switches are initially open and all $s_{bj}$ switches are initially closed (the capacitors are discharged). All voltages $v_j$ are equal to 0V. The processing of the pulse preferably starts with the switch $S_{a1}$ closed and the switch $S_{b1}$ open. When the charge Q is released, the voltage $v_1$, which is equal to the voltage V, increases with a time constant set by a resistor R. If the voltage $v_1=Q/C_1$ is increases until the discriminator dsc1 changes state, the switch $s_{a2}$ is closed and the switch $s_{b2}$ is open, adding one unit of capacitance $C_2$. The voltage $v_2$ then rapidly increases towards the voltage V. As in the prior circuit 30, new units of capacitance $C_j$ are progressively added until the voltage $V=Q/C_{sum}$, where $C_{sum}$ is the sum of enabled capacitors, is unable to trigger the next discriminator. The charge Q is now distributed among an appropriate number of capacitors $C_j$ that is proportional to the quantity of charge Q present. The result of the conversion can be used to increment on-chip counters or can be suitably encoded into a digital word of n-bits where $m=2^n$ as, for example, shown in FIG. 8.

Thus, the circuit 32 described above operates with charges in a charge-detect mode. Accordingly, circuit 32 provides information concerning the total injected charge that is distributed among a number of capacitors, which yields the digital word.

Figure 8A:
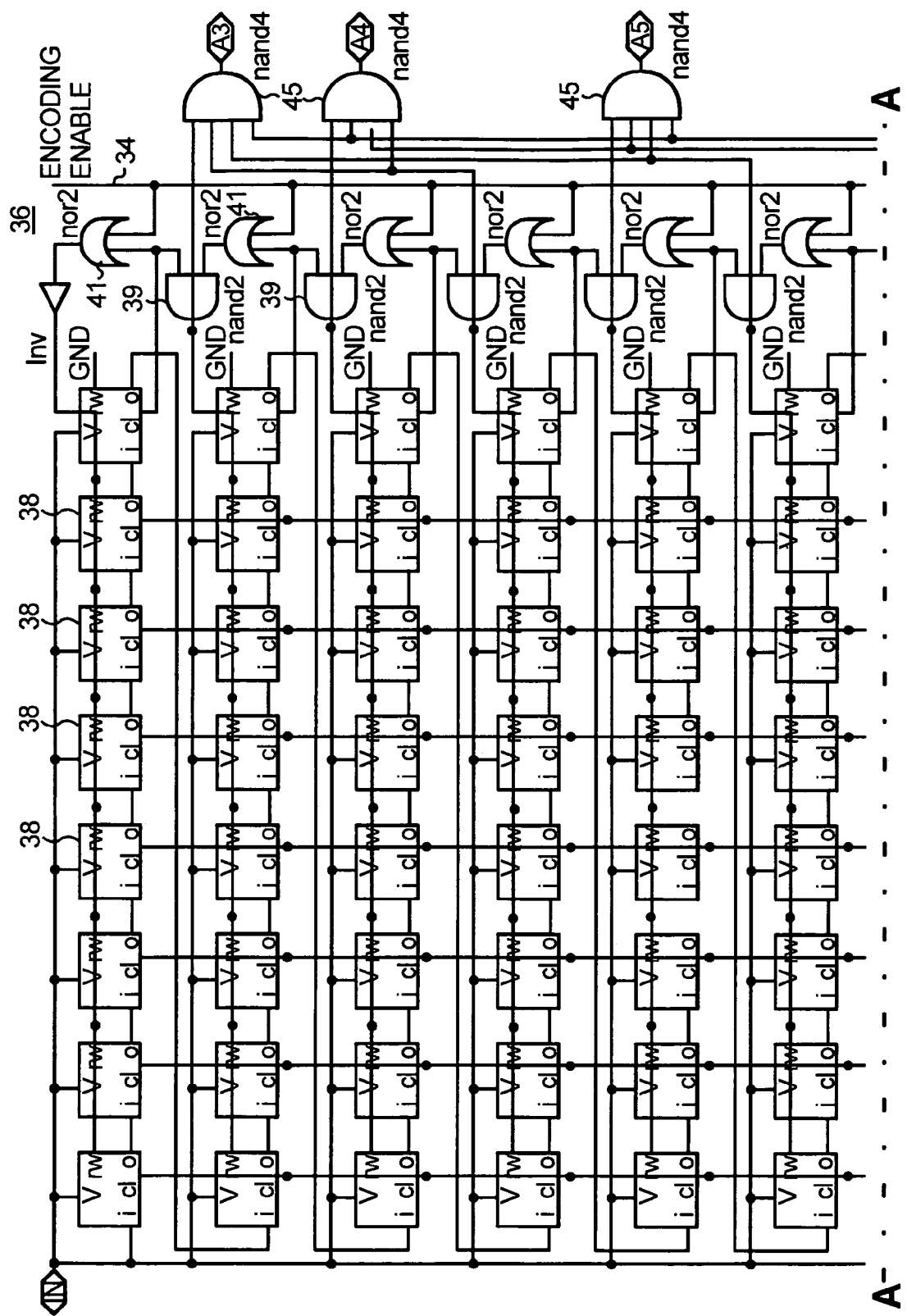
FIG. 8 is a CMOS integrated circuit realization of the circuit shown in FIG. 6.
Figure 8B:
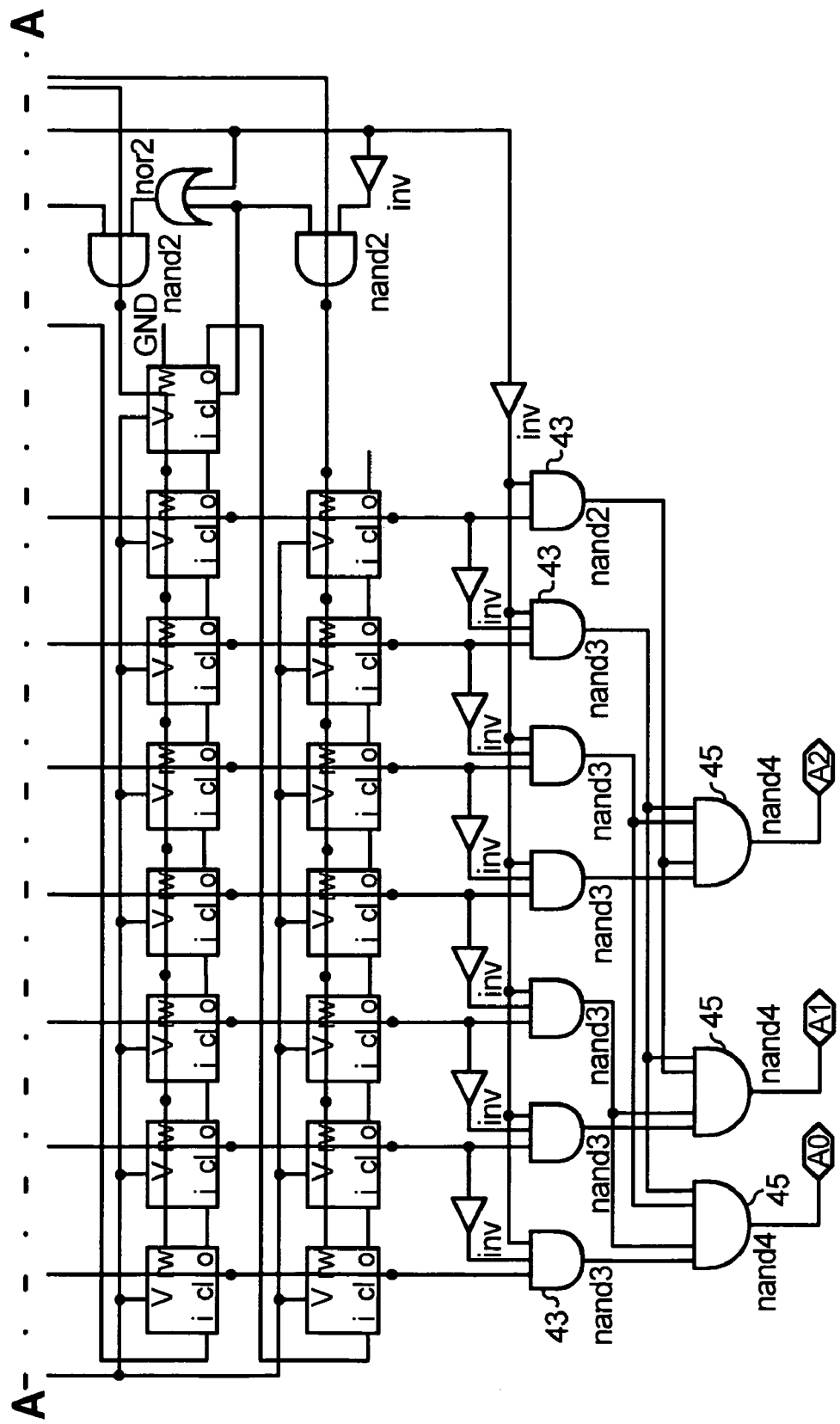

In both versions of the circuit 30, 32, encoding can be performed, for example, by accessing the unit cells in a suitable combination of rows (rw) and columns (cl), as shown in the CMOS integrated circuit of FIG. 8. An encoding enable signal 34 enables operation of the circuit 36. When an RW input of any cell 38 is low, the cell 38 controls the associated column line through its CL output. When the CL output of a cell 38 is high, it indicates that the current source of that cell 38 was added during the processing of the pulse (i.e., the cell is in an on state).

The encoding process is preferably enabled through the encoding enable signal 34 (active low) during tracking or, in order to minimize the digital activity, after the peak is found. When encoding is disabled, all RW inputs are preferably low and the associated column CL outputs are preferably floating. When encoding is enabled, the logic prevents a row from releasing the CL outputs unless all cells from the previous row are on (i.e. unless the last cell of the previous row is on). Nand2 gates 39 serve this purpose. A row is also prevented from releasing the CL outputs if its last cell is in the on state (i.e. if the whole row is on). Nor2 gates 41 serve this purpose. In this way, only a row at a time, the one which is partially on, can release the output through the CL outputs. The logic including nand3 43 and nand4 45 gates preferably provides the appropriate encoding. The resulting digital word is A0, A1, A2, A3, A4, A5, where A5 is the most significant bit (MSB).

Figure 9:
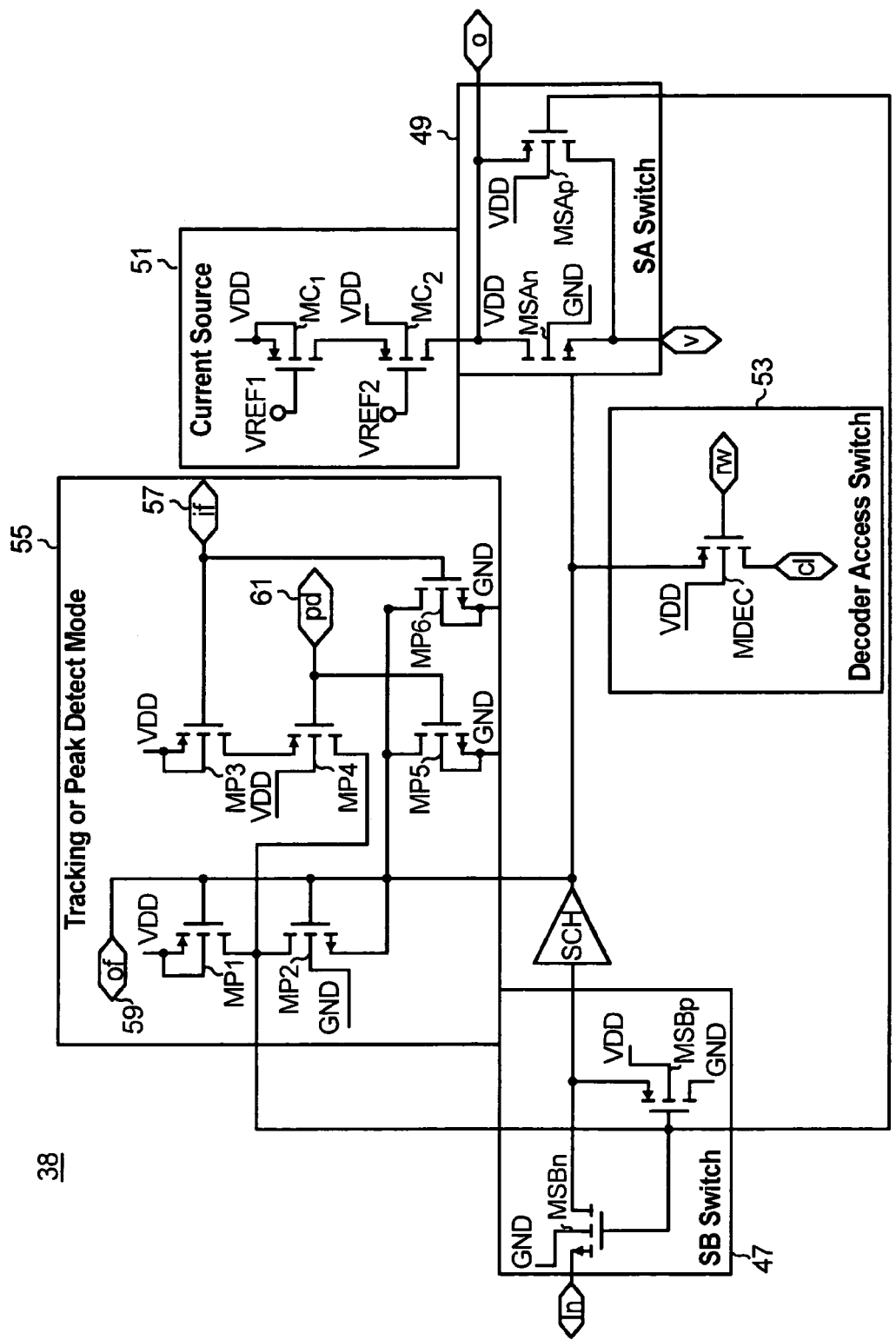
FIG. 9 is a cell of the CMOS integrated circuit realization shown in FIG. 8.

FIG. 9 shows a CMOS integrated circuit realization of an individual jth cell 38 of the circuit shown in FIG. 8. This realization operates with currents having a polarity opposite to that shown in FIG. 6, which indicates that the circuits in accordance with the present invention may be adapted to perform analog-to-digital conversion and peak detection of input signals having positive or negative polarity. In the cell 38, the logic circuitry for switching between peak detect mode and tracking mode is also implemented.

An SB switch 47, which includes transistors MSBn and MSBp, corresponds to switch $s_{bj}$ in FIG. 6. The SA switch 49, which includes transistors MSAn and MSAp, corresponds to $s_{aj+1}$ in FIG. 6. A current source 51, which includes transistors MC1 and MC2, corresponds to the current source $i_{j+1}$ in FIG. 6. The Schmitt trigger SCH corresponds to $dsc_j$ in FIG. 6. The decoder access switch 53 (MDEC) allows access to the cell 38 for decoding as shown in FIG. 8, which includes an rw (row) input and a cl (column) output. Tracking and peak detect mode circuitry 55 preferably allows switching operation between peak detect and tracking.

Each IF input 57 is preferably connected to an OF output 59 from the following cell. When the PD input 61 is high, an inverter, which includes transistors MP2 and MN2, is enabled independently of the IF input 57, and the circuit operates in peak detect mode, where the loop from the output of the Schmitt trigger SCH to the SB switch 47 is always active. When the PD input 61 is low, the SB switch 47 is kept closed only if the next cell is in the on state (IF input is high). As soon as the following cell enters an off state (IF input is low), the SB switch 47 is closed, which enables the cell 38 to switch to the off state if the current signal I decreases, and the circuit operates in tracking mode.

Figure 10:
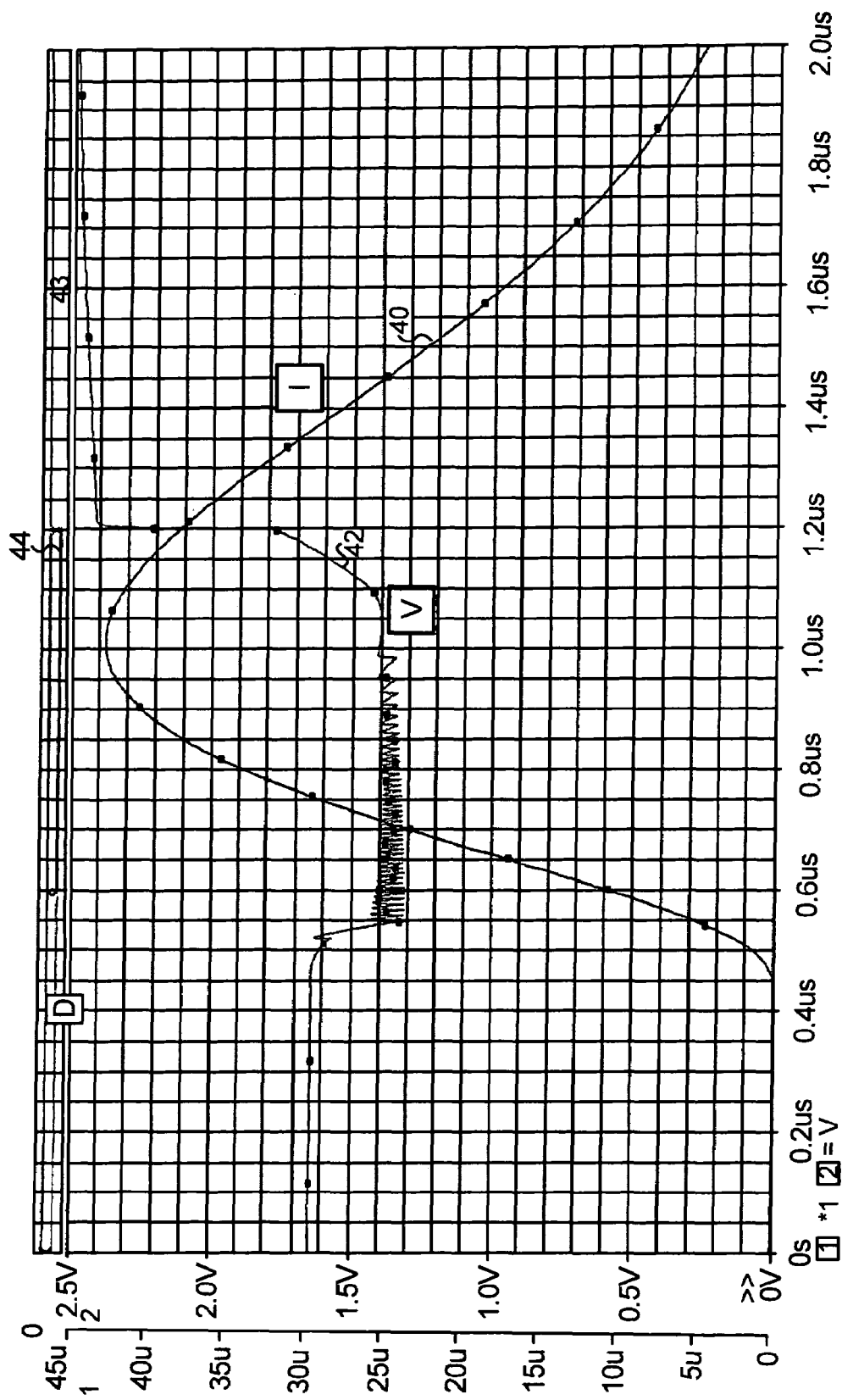
FIG. 10 is a SPICE simulation result of a peak detection and conversion of a shaped pulse for the cell shown in FIG. 9.
Figure 11:
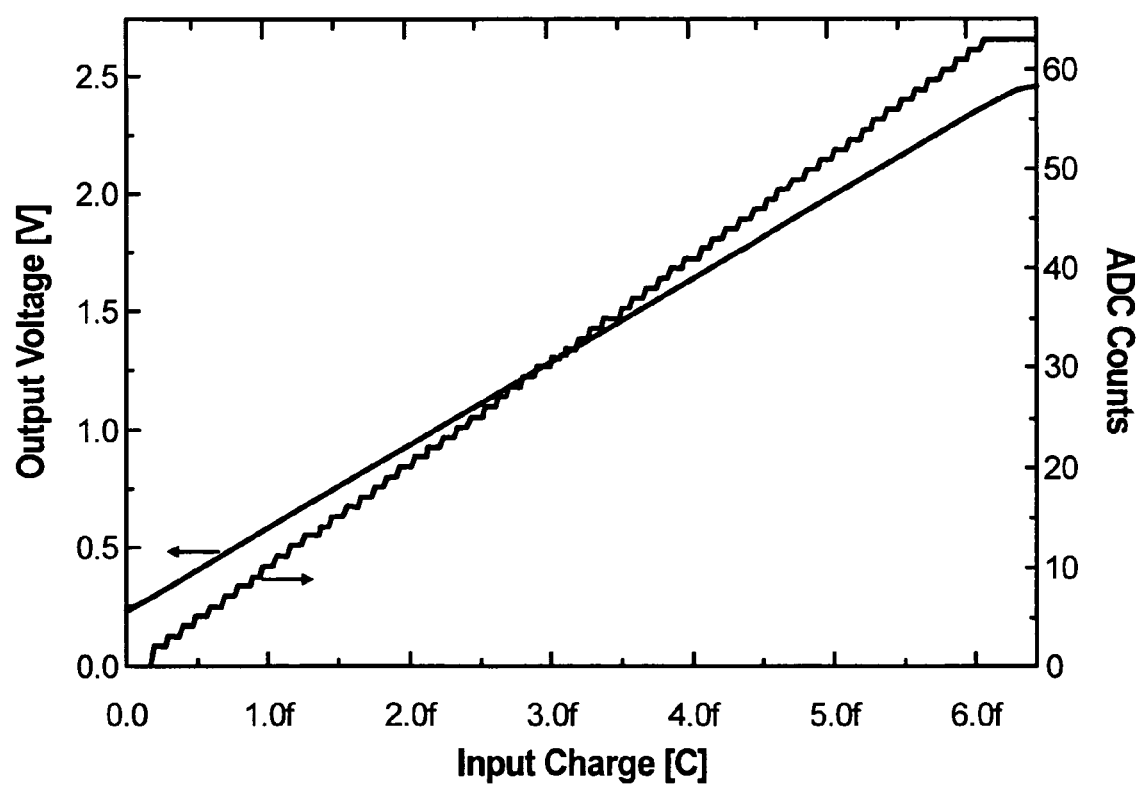
FIG. 11 shows the simulation values including input charge, analog pulse voltage, and corresponding analog-to-digital converter counts for the simulation results shown in FIG. 10.

FIG. 10 shows a SPICE simulation result of a peak detection and conversion of a shaped pulse for the cell 38 shown in FIG. 9, in which each current source has a current value of 1 µA. The waveform 40, which represents the current signal I, has a peak value of about 43 µA. The waveform 42, which represents the voltage signal V in FIG. 6, shows the individual comparison results. The waveform 44 is the output digital word with a value of 43 that corresponds to the peak value 43 µA of the shaped pulse. FIG. 11 shows the simulation values including input charge, analog pulse voltage, and corresponding ADC counts.

From the foregoing discussion, it will be appreciated by those skilled in the art that the present invention provides peak detection and analog-to-digital conversion of shaped analog pulses caused by an ionizing event in a radiation detection system without requiring a clock signal and using very little power. In addition, since analog-to-digital conversion occurs during a rising edge of the shaped pulse and conversion is complete when the peak occurs, the present invention advantageously minimizes the processing time of the shaped pulse and, as a consequence, the loss of data.

Although illustrative embodiments of the present invention have been described herein with reference to the accompanying drawing, it is to be understood that the invention is not limited to those precise embodiments, and that various other changes and modifications may be effected therein by one skilled in the art without departing from the scope or spirit of the invention.

The invention claimed is:

1. An analog-to-digital converter comprising at least one stage, a first stage comprising:
   a first switch comprising a first terminal and a second terminal, the first terminal of the first switch being operatively coupled to an input signal;
   a second switch comprising a first terminal and a second terminal, the first terminal of the second switch being operatively coupled to the second terminal of the first switch;
   a first current source operatively coupled to the second terminal of the first switch, at least a portion of a first threshold being determined by the first current source; and
   a first discriminator operatively coupled to the second terminal of the second switch, the second switch being closed and the first switch being closed, the first discriminator changing state and the second switch being opened in response to a current associated with the input signal exceeding the first threshold, thereby indicating whether the current associated with the input signal is greater than the first threshold.

2. An analog-to-digital converter defined by claim 1, further comprising a control circuit, at least one of the first switch and the second switch being responsive to the control circuit.

3. An analog-to-digital converter defined by claim 1, wherein the input signal comprises at least one of positive polarity and negative polarity.

4. An analog-to-digital converter defined by claim 1, wherein the first discriminator comprises at least one of an inverter, non-inverter, Schmitt trigger, and gate.

5. An analog-to-digital converter defined by claim 1, wherein at least one of the first switch, second switch, and first current source comprises a transistor.

6. An analog-to-digital converter defined by claim 1, wherein the input signal comprises a peak, the converter comprising a peak detect mode in which a state of the second switch is retained in response to a decrease in the current associated with the input signal following the peak, the state of the first switch representing at least a portion of a value of the peak.

7. An analog-to-digital converter defined by claim 1, further comprising a second stage, the second stage comprising:
   a third switch comprising a first terminal and a second terminal, the first terminal of the third switch being operatively coupled to the input signal;
   a fourth switch comprising a first terminal and a second terminal, the first terminal of the fourth switch being operatively coupled to the second terminal of the third switch;
   a second current source operatively coupled to the second terminal of the third switch, at least a portion of a second threshold being determined by the second current source; and
   a second discriminator operatively coupled to the second terminal of the fourth switch, the fourth switch being closed, the third switch being closed in response to the current associated with the input signal exceeding the first threshold, the second discriminator changing state and the fourth switch being opened in response to the current associated with the input signal exceeding the second threshold, thereby indicating whether the current associated with the input signal is greater than the second threshold.

8. An analog-to-digital converter defined by claim 7, further comprising a control circuit, at least one of the third switch and the fourth switch being responsive to the control circuit.

9. An analog-to-digital converter defined by claim 7, wherein the second discriminator comprises at least one of an inverter, non-inverter, Schmitt trigger, and gate.

10. An analog-to-digital converter defined by claim 7, wherein at least one of the third switch, fourth switch, and second current source comprises a transistor.

11. An analog-to-digital converter defined by claim 7, wherein the input signal comprises a peak, the converter comprising a peak detect mode in which a state of the fourth switch is retained in response to a decrease in the current associated with the input signal following the peak, the state of the third switch representing at least a portion of a value of the peak.

12. An analog-to-digital converter comprising at least one stage, a first stage comprising:
   a first switch comprising a first terminal and a second terminal, the first terminal of the first switch being operatively coupled to an input signal;
   a second switch comprising a first terminal and a second terminal, the first terminal of the second switch being operatively coupled to the second terminal of the first switch;
   a first capacitor operatively coupled in parallel across the first and second terminals of the second switch, at least a portion of a first threshold being determined by the first capacitor; and
   a first discriminator operatively coupled to the first terminal of the second switch, the first switch being closed and the second switch being open, the first discriminator changing state in response to a charge associated with the input signal exceeding the first threshold, thereby indicating whether the charge associated with the input signal is greater than the first threshold.

13. An analog-to-digital converter defined by claim 12, further comprising a control circuit, at least one of the first switch and the second switch being responsive to the control circuit.

14. An analog-to-digital converter defined by claim 12, wherein the input signal comprises at least one of positive polarity and negative polarity.

15. An analog-to-digital converter defined by claim 12 wherein the first discriminator comprises at least one of an inverter, non-inverter, Schmitt trigger, and gate.

16. An analog-to-digital converter defined by claim 12, wherein at least one of the first switch and the second switch comprises a transistor.

17. An analog-to-digital converter defined by claim 12, wherein the input signal comprises a peak, the converter comprising a charge detect mode in which the charge of the first capacitor is retained in response to a decrease in the charge associated with the input signal, a state of the first switch representing at least a portion of a value of the input charge.

18. An analog-to-digital converter defined by claim 12, further comprising a second stage, the second stage comprising:
   a third switch comprising a first terminal and a second terminal, the first terminal of the third switch being operatively coupled to the input signal;
   a fourth switch comprising a first terminal and a second terminal, the first terminal of the fourth switch being operatively coupled to the second terminal of the third switch;
   a second capacitor operatively coupled in parallel across the first and second terminals of the fourth switch, at least a portion of a second threshold being determined by the second capacitor; and
   a second discriminator operatively coupled to the first terminal of the second switch, the third switch being closed and the fourth switch being opened in response to the charge associated with the input signal exceeding the first threshold, the second discriminator changing state in response to the charge associated with the input signal exceeding the second threshold, thereby indicating whether the charge associated with the input signal is greater than the second threshold.

19. An analog-to-digital converter defined by claim 18, further comprising a control circuit, at least one of the third switch and the fourth switch being responsive to the control circuit.

20. An analog-to-digital converter defined by claim 18, wherein the second discriminator comprises at least one of an inverter, non-inverter, Schmitt trigger, and gate.

21. An analog-to-digital converter defined by claim 18, wherein at least one of the third switch and the fourth switch comprises a transistor.

22. An analog-to-digital converter defined by claim 12, further comprising a resistor operatively coupled in series with the input signal.

23. An analog-to-digital converter defined by claim 18, wherein the input signal comprises a peak, the converter comprising a charge detect mode in which the charge of the second capacitor is retained in response to a decrease in the charge associated with the input signal, a state of the third switch representing at least a portion of a value of the input charge.

24. A method of analog-to-digital conversion comprising:
   coupling a first terminal of a first switch operatively to an input signal;
   coupling a first terminal of a second switch operatively to a second terminal of the first switch, the second switch being closed;
   coupling a first current source operatively to the second terminal of the first switch, at least a portion of a first threshold being determined by the first current source;
   coupling a first discriminator operatively to a second terminal of the second switch;
   closing the first switch; and
   opening the second switch and the discriminator changing state in response to a current associated with the input signal exceeding the first threshold, thereby indicating whether the current associated with the input signal is greater than the first threshold.

25. A method of analog-to-digital conversion defined by claim 24, wherein the input signal comprises at least one of positive polarity and negative polarity.

26. A method of analog-to-digital conversion defined by claim 24, wherein the input signal comprises a peak, the converter comprising a peak detect mode comprising retaining a state of the second switch in response to a decrease in the current associated with the input signal following the peak, the state of the first switch representing at least a portion of a value of the peak.

27. A method of analog-to-digital conversion defined by claim 24, further comprising:
   coupling a first terminal of a third switch operatively to an input signal;
   coupling a first terminal of a fourth switch operatively to a second terminal of the third switch, the fourth switch being closed;
   coupling a second current source operatively to a second terminal of the third switch, at least a portion of a second threshold being determined by the second current source;
   coupling a second discriminator operatively to a second terminal of the fourth switch;
   closing the third switch in response to the current associated with the input signal exceeding the first threshold; and opening the fourth switch and the second discriminator changing state in response to the current associated with the input signal exceeding the second threshold, thereby indicating whether the current associated with the input signal is greater than the second threshold.

28. A method of analog-to-digital conversion defined by claim 27, wherein the input signal comprises a peak, the converter comprising a peak detect mode comprising retaining a state of the fourth switch in response to a decrease in the current associated with the input signal following the peak, the state of the third switch representing at least a portion of a value of the peak.

29. A method of analog-to-digital conversion comprising:
   coupling a first terminal of a first switch operatively to an input signal;
   coupling a first terminal of a second switch operatively to a second terminal of the first switch;
   coupling a first capacitor operatively in parallel across the first and second terminals of the second switch, at least a portion of a first threshold being determined by the first capacitor;
   coupling a first discriminator operatively to the first terminal of the second switch;
   closing the first switch and opening the second switch, the first discriminator changing state in response to a charge associated with the input signal exceeding the first threshold, thereby indicating whether the charge associated with the input signal is greater than the first threshold.

30. A method of analog-to-digital conversion defined by claim 29, wherein the input signal comprises at least one of positive polarity and negative polarity.

31. A method of analog-to-digital conversion defined by claim 29, wherein the input signal comprises a peak, the converter comprising a charge detect mode comprising retaining the charge of the first capacitor in response to a decrease in the charge associated with the input signal, a state of the first switch representing at least a portion of a value of the input charge.

32. A method of analog-to-digital conversion defined by claim 29, further comprising:
   coupling a first terminal of a third switch operatively to the input signal;
   coupling a first terminal of a fourth switch operatively to a second terminal of the third switch;
   coupling a second capacitor operatively in parallel across the first and second terminals of the fourth switch, at least a portion of a second threshold being determined by the first capacitor;
   coupling a second discriminator operatively to the first terminal of the second switch; and
   closing the third switch and opening the fourth switch in response to the first discriminator changing state, the second discriminator changing state in response to a charge associated with the input signal exceeding the second threshold, thereby indicating whether the charge associated with the input signal is greater than the second threshold.

33. A method of analog-to-digital conversion defined by claim 29, further comprising coupling a resistor operatively in series with the input signal.

* * * * *